(12) United States Patent
Ooka et al.

(10) Patent No.: US 10,890,360 B2
(45) Date of Patent: Jan. 12, 2021

(54) HEAT EXCHANGER

(71) Applicant: SHINWA CONTROLS CO., LTD, Kawasaki (JP)

(72) Inventors: Hidemitsu Ooka, Kawasaki (JP); Shigehiko Ono, Kawasaki (JP)

(73) Assignee: Shinwa Controls, Co., Ltd., Kawasaki (JP)

( * ) Notice: Subject to any disclaimer, the term of this patent is extended or adjusted under 35 U.S.C. 154(b) by 58 days.

(21) Appl. No.: 16/330,519

(22) PCT Filed: Sep. 26, 2017

(86) PCT No.: PCT/JP2017/034641
§ 371 (c)(1),
(2) Date: Mar. 5, 2019

(87) PCT Pub. No.: WO2018/056457
PCT Pub. Date: Mar. 29, 2018

(65) Prior Publication Data
US 2019/0195537 A1 Jun. 27, 2019

(30) Foreign Application Priority Data
Sep. 26, 2016 (JP) .................................. 2016-187195

(51) Int. Cl.
*F28F 13/00* (2006.01)
*F25B 9/14* (2006.01)
(Continued)

(52) U.S. Cl.
CPC .................. *F25B 9/14* (2013.01); *F28F 3/12* (2013.01); *F28F 13/08* (2013.01); *H01L 23/473* (2013.01);
(Continued)

(58) Field of Classification Search
CPC .... F25B 9/14; F28F 3/12; F28F 13/08; H01L 23/473; H05K 7/20254
(Continued)

(56) References Cited

U.S. PATENT DOCUMENTS 6,039,114 A  3/2000 Becker et al.
6,719,039 B2 * 4/2004 Calaman ............... F28F 3/022
165/168

(Continued)

FOREIGN PATENT DOCUMENTS

JP    H11-506873 A1   6/1999
JP    2005-166751 A1  6/2005
(Continued)

OTHER PUBLICATIONS

International Search Report and Written Opinion (Application No. PCT/JP2017/034641) dated Nov. 28, 2017.

*Primary Examiner* — Davis D Hwu
(74) *Attorney, Agent, or Firm* — Burr & Brown, PLLC

(57) ABSTRACT

A heat exchanger provided with: a plate member having a flat bottom part and a refrigerant flow path formed therein; and a plate cover for covering the plate member. The plate cover has a refrigerant inlet communicating with an area on one side of the refrigerant flow path, and a refrigerant outlet communicating with an area on the other side of the refrigerant flow path. The refrigerant flow path is more densely arranged in an area far from a straight line connecting the area that is on the one side and communicates with the refrigerant inlet to the area that is on the other side and communicates with the refrigerant outlet, than in an area close to the straight line connecting the area that is on the one side and communicates with the refrigerant inlet to the area that is on the other side and communicates with the refrigerant outlet.

7 Claims, 6 Drawing Sheets

(51) Int. Cl.
 *F28F 3/12* (2006.01)
 *F28F 13/08* (2006.01)
 *H01L 23/473* (2006.01)
 *H05K 7/20* (2006.01)

(52) U.S. Cl.
 CPC ...... *H05K 7/20254* (2013.01); *F28F 2215/04* (2013.01)

(58) Field of Classification Search
 USPC .......................................................... 165/146
 See application file for complete search history.

(56) References Cited

U.S. PATENT DOCUMENTS

| | | | |
|---|---|---|---|
| 2005/0103486 A1* | 5/2005 | Demuth | F28D 1/05391 165/174 |
| 2010/0172091 A1 | 7/2010 | Nishiura | |
| 2010/0290190 A1 | 11/2010 | Chester et al. | |
| 2013/0074490 A1 | 3/2013 | Narisawa et al. | |
| 2013/0146273 A1 | 6/2013 | Chester et al. | |
| 2013/0208421 A1 | 8/2013 | Chester et al. | |
| 2015/0345705 A1 | 12/2015 | Seki et al. | |
| 2016/0262287 A1 | 9/2016 | Chester et al. | |
| 2016/0286693 A1 | 9/2016 | Chester et al. | |
| 2017/0150649 A1 | 5/2017 | Chester et al. | |

FOREIGN PATENT DOCUMENTS

| | | |
|---|---|---|
| JP | 2010-098204 A1 | 4/2010 |
| JP | 2010-153785 A1 | 7/2010 |
| JP | 2011-187599 A1 | 9/2011 |
| JP | 2012-527109 A1 | 11/2012 |
| JP | 2013-068362 A1 | 4/2013 |
| JP | 2015-127564 A1 | 7/2015 |

\* cited by examiner

HEAT EXCHANGER

TECHNICAL FIELD

The present invention relates to a heat exchanger suitable for being combined with a refrigerator whose heat absorbing portion has a flat shape.

BACKGROUND ART

Twinbird Corporation has developed and marketed a Stirling type of refrigerator which can achieve extremely high performance (trade name: "Stirling Cooler", model number: "SC-UE15R"). This Stirling type of refrigerator adopts a Stirling-cycle engine disclosed in JP-A-2013-068362, whose heat absorbing portion has a flat disk shape, as shown in FIG. 8.

The inventors of the present invention have studied adopting the above Stirling type of refrigerator for a refrigerating unit to be used in a cooled-hydrogen supply station disclosed in JP-A-2015-127564.

SUMMARY OF INVENTION

As described above, the above Stirling type of refrigerator has a heat absorbing portion with a flat disk-like shape as shown in FIG. 8.

Unfortunately, there was no heat exchanger configured to efficiently exchange heat between such a heat absorbing portion and any refrigerant (coolant).

Initially, the inventors of the present invention made a prototype of a heat exchanger having a labyrinth-like refrigerant flow path formed therein, as shown in FIG. 9.

According to the inventors of the present invention, it has been verified that a refrigerant flow path following such a complicated path can exhibit considerably high heat-exchange performance. However, due to the complicated path, they have also found a problem that a pressure loss of the refrigerant is undesirably high, that is, driving energy for circulating the refrigerant has to be undesirably high.

In fact, according to the pattern of the refrigerant flow path shown in FIG. 9 (the width of each groove: 3.2 mm, the depth of each groove: 8.0 mm), high heat-exchange performance as much as 192 W is achieved, but a pressure loss as much as 394 kPa is also produced.

The present invention was made based on the above findings. An object of the present invention is to provide a heat exchanger which is suitable for being combined with a refrigerator whose heat absorbing portion has a flat shape and which can suppress a pressure loss of the refrigerant while providing high heat-exchange performance.

The present invention is a heat exchanger comprising: a plate member having a flat bottom part and having a refrigerant flow path formed therein; and a plate cover configured to cover the plate member; wherein the plate cover has: a refrigerant inlet communicating with an area on one side of the refrigerant flow path of the plate member and; a refrigerant outlet communicating with an area on the other side of the refrigerant flow path of the plate member, and arrangement density of the refrigerant flow path is higher in an area far from a straight line which connects the area on the one side communicating with the refrigerant inlet to the area on the other side communicating with the refrigerant outlet, than in an area close to the straight line which connects the area on the one side communicating with the refrigerant inlet to the area on the other side communicating with the refrigerant outlet.

According to the present invention, since the arrangement density of the refrigerant flow path is higher in the area far from the straight line which connects the area on the one side communicating with the refrigerant inlet to the area on the other side communicating with the refrigerant outlet, than in the other area close to the straight line which connects the area on the one side communicating with the refrigerant inlet to the area on the other side communicating with the refrigerant outlet, the refrigerant can flow in a well-balanced manner in respective routes from the area on the one side communicating with the refrigerant inlet toward the area on the other side communicating with the refrigerant outlet. Thereby, a pressure low of the refrigerant in the whole heat exchanger can be effectively suppressed.

Specifically, for example, it is preferable that the refrigerant flow path has a rhombic lattice pattern in plan view.

In this case, high heat-exchange performance can be achieved easily. In addition, it is also easy to design and manufacture the higher or lower arrangement density of the refrigerant flow path.

Furthermore, in this case, it is preferable that groove elements of the rhombic lattice pattern are constant in width perpendicular to an extending direction of each of the groove elements. Such groove elements can be manufactured by means of the same machining tool, which facilitates the manufacturing process. In addition, it is easy to design them as well. In addition, in this case, the arrangement density of the refrigerant flow path is dependent on arrangement density of the groove elements (for example, gaps between adjacent groove elements) of the rhombic lattice pattern.

According to a verification experiment carried out by the inventors of the present invention using an actual prototype having such a rhombic lattice pattern, they have found out it is preferable that each of the groove elements has a width of 1.2 mm to 2.0 mm, each of the groove elements has a depth of 5.0 mm to 8.0 mm, and the plate member has a thickness of 7.0 mm to 10.0 mm.

Since the above Stirling type of refrigerator has a heat absorbing portion with a flat disk-like shape as shown in FIG. 8, it is preferable that the plate member (the bottom part of the plate member) of the heat exchanger of the present invention also has a circular disk-like shape in plan view. In this case, furthermore, it is preferable that the straight line, which connects the area on the one side communicating with the refrigerant inlet to the area on the other side communicating with the refrigerant outlet, extends in a diametric direction of the plate member. In addition, in this case, furthermore, it is preferable that the arrangement density of the refrigerant flow path is higher in an area far from a center of the plate member, than in an area close to the center of the plate member.

In the present invention, in order to facilitate the manufacturing process thereof, it is preferable that the plate member and the plate cover are separate, which is, however, functionally not essential. That is to say, the present invention may be a heat exchanger having a flat bottom part and having a refrigerant flow path formed therein, wherein a refrigerant inlet communicating with an area on one side of the refrigerant flow path and a refrigerant outlet communicating with an area on the other side of the refrigerant flow path are provided to protrude in the same direction, and arrangement density of the refrigerant flow path is higher in an area far from a straight line which connects the area on the one side communicating with the refrigerant inlet to the area on the other side communicating with the refrigerant outlet, than in an area close to the straight line which connects the area on the one side communicating with the refrigerant inlet to the area on the other side communicating with the refrigerant outlet.

According to the present invention, since the arrangement density of the refrigerant flow path is higher in the area far from the straight line which connects the area on the one side communicating with the refrigerant inlet to the area on the other side communicating with the refrigerant outlet, than in the other area close to the straight line which connects the area on the one side communicating with the refrigerant inlet to the area on the other side communicating with the refrigerant outlet, the refrigerant can flow in a well-balanced manner in respective routes from the area on the one side communicating with the refrigerant inlet toward the area on the other side communicating with the refrigerant outlet. Thereby, a pressure low of the refrigerant in the whole heat exchanger can be effectively suppressed.

DESCRIPTION OF EMBODIMENTS

An embodiment of the present invention will be described below with reference to the attached drawings.

Figure 1:
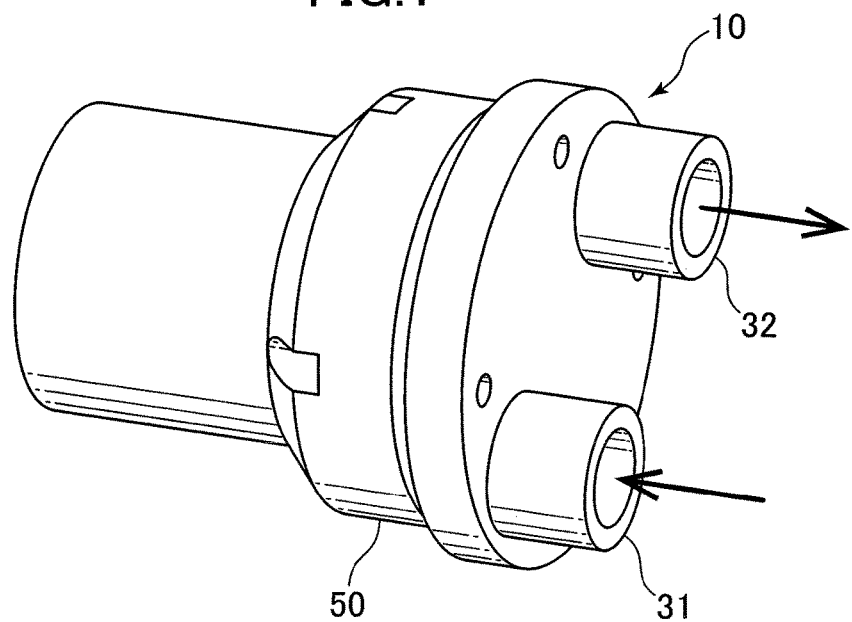
FIG. 1 is a perspective view of a state wherein a heat exchanger according to an embodiment of the present invention is assembled to a refrigerator.
Figure 2:
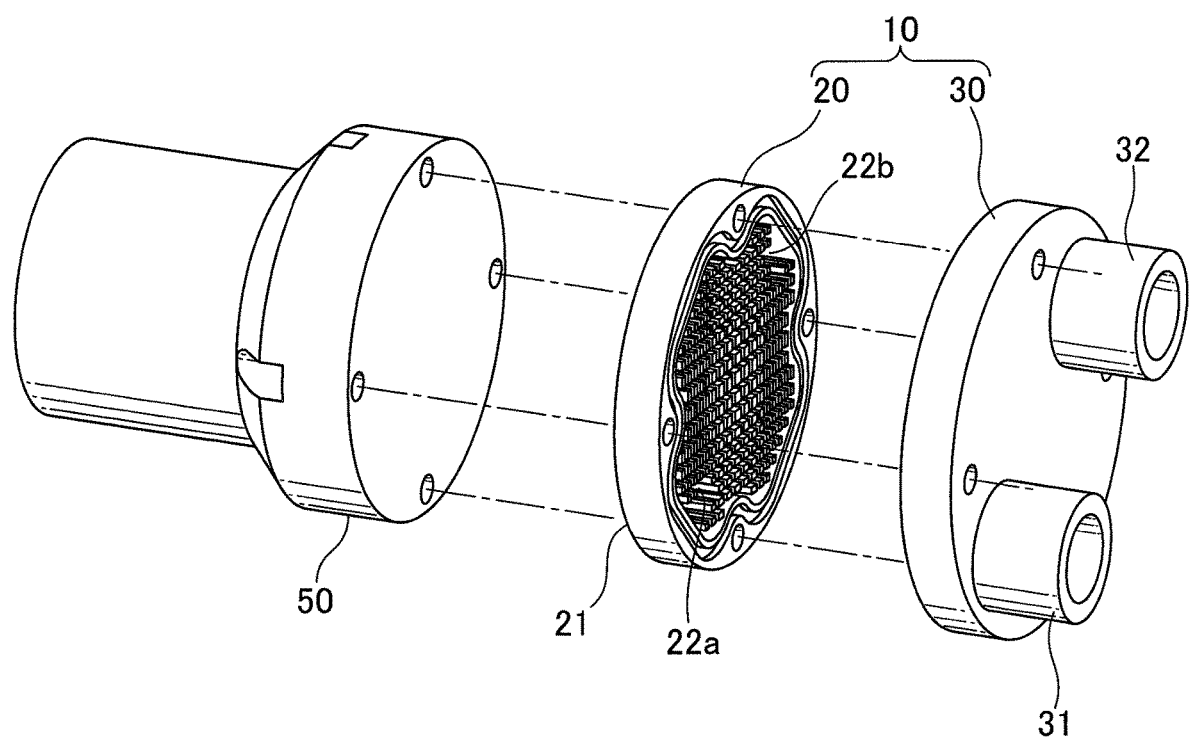
FIG. 2 is a perspective view of an exploded state of the heat exchanger shown in FIG. 1.
Figure 3:
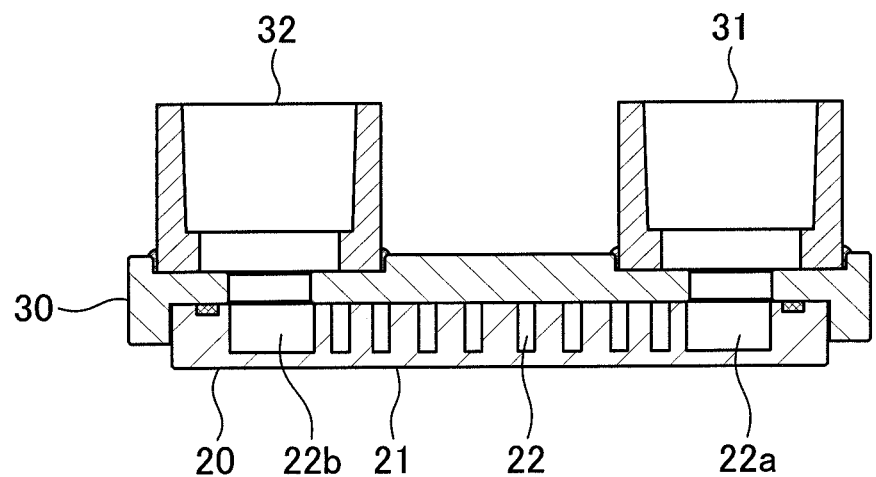
FIG. 3 is a longitudinal section view of the heat exchanger shown in FIG. 1.

FIG. 1 is a perspective view of a state wherein a heat exchanger 10 according to an embodiment of the present invention is assembled to a Stirling type of refrigerator 50. FIG. 2 is a perspective view of an exploded state of the heat exchanger 10. FIG. 3 is a longitudinal section view of the heat exchanger 10.

As shown in FIGS. 1 to 3, the heat exchanger 10 according to the present embodiment has: a plate member 20 having a flat bottom part 21 and having a refrigerant flow path 22 formed therein; and a plate cover 30 configured to cover the plate member 20. The plate member 20 is made of aluminum alloy. The plate cover 30 is made of stainless steel, but may be made of aluminum alloy.

The plate cover 30 is provided with: a refrigerant inlet 31 communicating with an area 22a on one side of the refrigerant flow path 22 of the plate member 20 and; a refrigerant outlet 32 communicating with an area 22b on the other side of the refrigerant flow path 22 of the plate member 20.

As shown in FIGS. 1 to 3, the plate member 20 of the present embodiment has a circular disk-like shape in plan view. A straight line which connects the area 22a on the one side communicating with the refrigerant inlet 31 to the area 22b on the other side communicating with the refrigerant outlet 32 extends in a diametric direction of the plate member 20.

In addition, as shown in FIGS. 1 and 2, in the plate member 20 of the present embodiment, the refrigerant inlet 31 communicating with the area 22a on one side of the refrigerant flow path 22 and the refrigerant outlet 32 communicating with the area 22b on the other side of the refrigerant flow path 22 are provided to protrude in the same direction.

Figure 4:
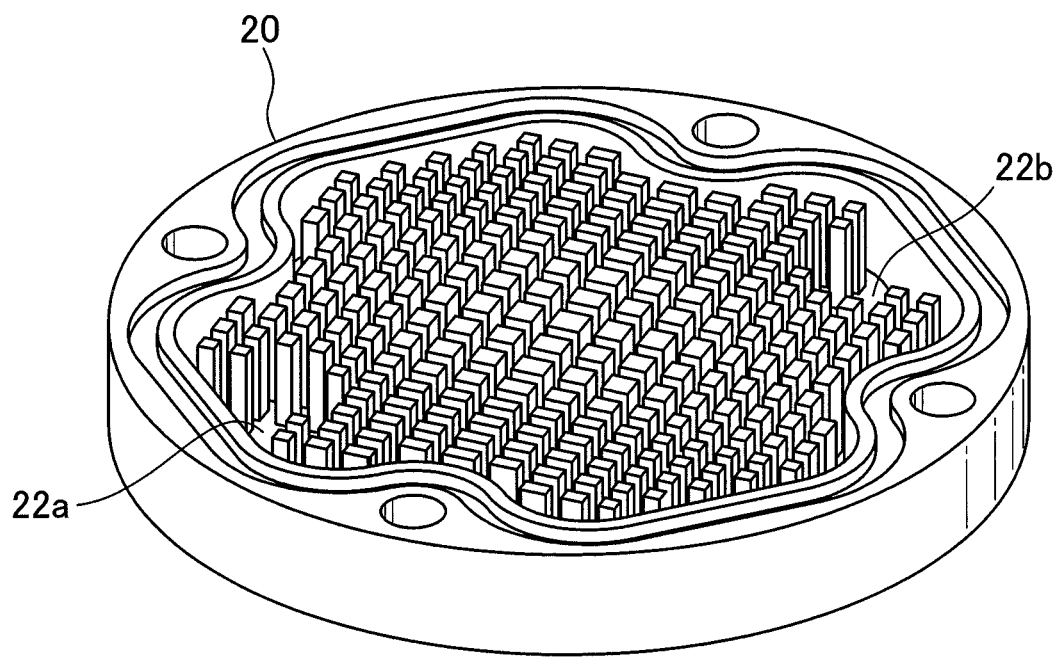
FIG. 4 is a perspective view of the plate member of the heat exchanger shown in FIG. 1.
Figure 5:
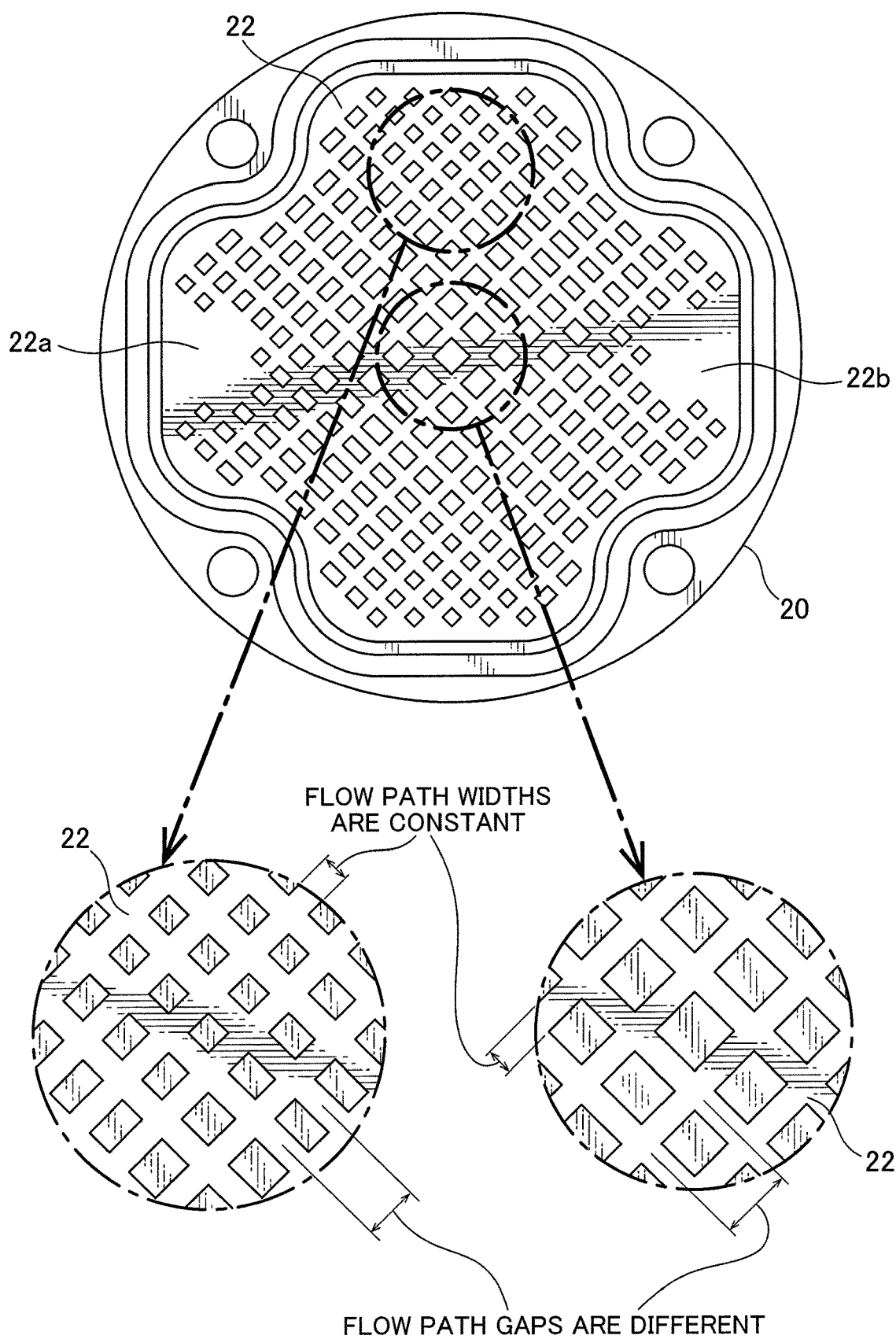
FIG. 5 is a plan view of the plate member of the heat exchanger shown in FIG. 1.
Figure 6:
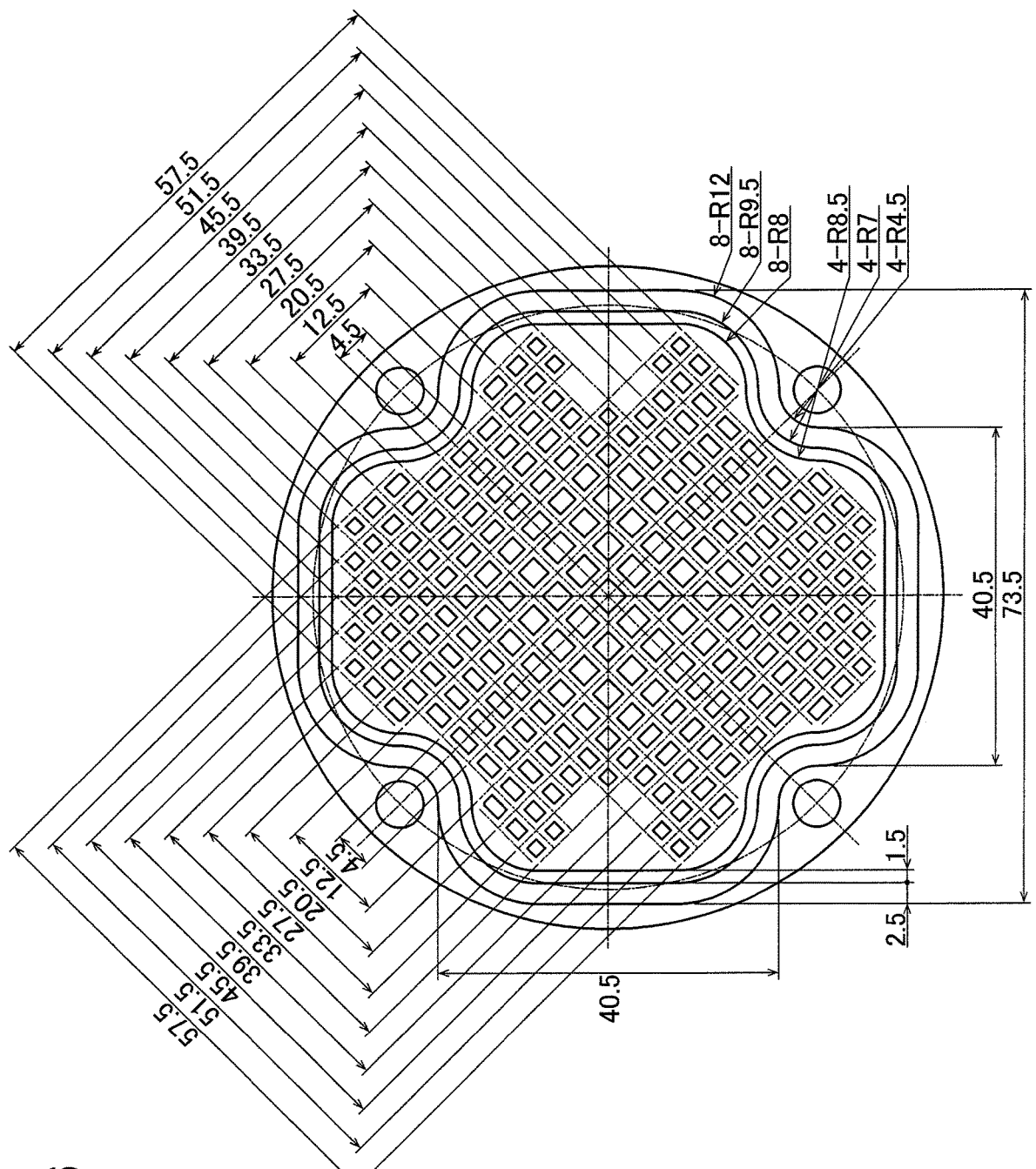
FIG. 6 is a plan view of the plate member of the heat exchanger shown in FIG. 1, in which exemplary detailed dimensions are provided.

Subsequently, FIG. 4 is a perspective view of the plate member 20 of the heat exchanger 10 according to the present embodiment, FIG. 5 is a plan view of the plate member 20 of the heat exchanger 10 according to the present embodiment, and FIG. 6 is a plan view of the plate member 20 of the heat exchanger 10 according to the present embodiment, in which exemplary detailed dimensions are provided.

As shown in FIGS. 4 to 6, arrangement density of the refrigerant flow path 22 is higher in an area far from the straight line which connects the area 22a on the one side communicating with the refrigerant inlet 31 to the area 22b on the other side communicating with the refrigerant outlet 32, than in an area close to the straight line which connects the area 22a on the one side communicating with the refrigerant inlet 31 to the area 22b on the other side communicating with the refrigerant outlet 32. In addition, in the present embodiment, the arrangement density of the refrigerant flow path 22 is higher in an area far from a center of the plate member 20 having the circular disk-like shape in plan view, than in an area close to the center of the plate member 20 having the circular disk-like shape in plan view.

Thus, the refrigerant can flow in a well-balanced manner in respective routes from the area 22a on the one side communicating with the refrigerant inlet 31 toward the area 22b on the other side communicating with the refrigerant outlet 32. Thereby, a pressure low of the refrigerant in the whole heat exchanger can be effectively suppressed.

In particular, as shown in FIGS. 4 to 6, the refrigerant flow path 22 of the present embodiment has a rhombic lattice pattern in plan view. In the rhombic lattice pattern of the present embodiment, orthogonal lattice pattern is tilted by 45 degrees with respect to the straight line which connects the area 22a on the one side communicating with the refrigerant inlet 31 to the area 22b on the other side communicating with the refrigerant outlet 32.

According to the above configuration, high heat-exchange performance can be achieved. In addition, it is also easy to design and manufacture the higher or lower arrangement density of the refrigerant flow path 22.

Furthermore, in the present embodiment, as shown in FIG. 5, groove elements (flow path elements) of the rhombic lattice pattern are constant in width perpendicular to an extending direction thereof. Such groove elements (flow path elements) can be manufactured by means of the same machining tool, which facilitates the manufacturing process. In addition, it is easy to design them as well. In this case, the arrangement density of the refrigerant flow path 22 is dependent on arrangement density of the groove elements (for example, gaps between adjacent groove elements) of the rhombic lattice pattern.

According to a verification experiment carried out by the inventors of the present invention using an actual prototype having such a rhombic lattice pattern, it is preferable that each of the groove elements has a width of 1.2 mm to 2.0 mm, each of the groove elements has a depth of 5.0 mm to 8.0 mm, and the plate member 20 has a thickness of 7.0 mm to 10.0 mm. As an example, in the present embodiment, each of the groove elements has a width of 1.5 mm, each of the groove elements has a depth of 6.0 mm, and the plate member 20 has a thickness of 8.0 mm.

In addition, as shown in FIG. 6, the gaps between central lines of adjacent groove elements are 4.5 mm, 4.0 mm (×2), 3.5 mm (×1) and 3.0 mm (×5) in order of from the central side.

Next, an operation of the present embodiment is explained.

In order to evaluate performance of the present embodiment, as shown in FIG. 1, the heat exchanger 10 according to the present embodiment was assembled to the heat absorbing portion of the Stirling type of refrigerator (trade name: "Stirling Cooler", model number: "SC-UE15R") manufactured by Twinbird Corporation. Then, heat-exchange performance thereof and a pressure loss of the refrigerant (coolant) were evaluated. As the refrigerant (coolant), cold brine FP-40 (potassium formate solution) manufactured by Showa Corporation was used.

As a result, high heat-exchange performance as much as 205 W was achieved, and also the pressure loss was reduced to about 35.6 kPa.

(Variation 1)

From the above embodiment, the depth of each groove element was reduced to 5.0 mm and the thickness of the plate member 20 was reduced to 7.0 mm. In this case as well, high heat-exchange performance as much as 196 W was achieved, and also the pressure loss was reduced to about 45.5 kPa.

(Variation 2)

From the above embodiment, to the contrary, the depth of each groove element was increased to 8.0 mm and the thickness of the plate member 20 was increased to 10.0 mm. In this case as well, high heat-exchange performance as much as 219 W was achieved, and also the pressure loss was reduced to about 25.7 kPa.

(Variation 3)

Figure 7:
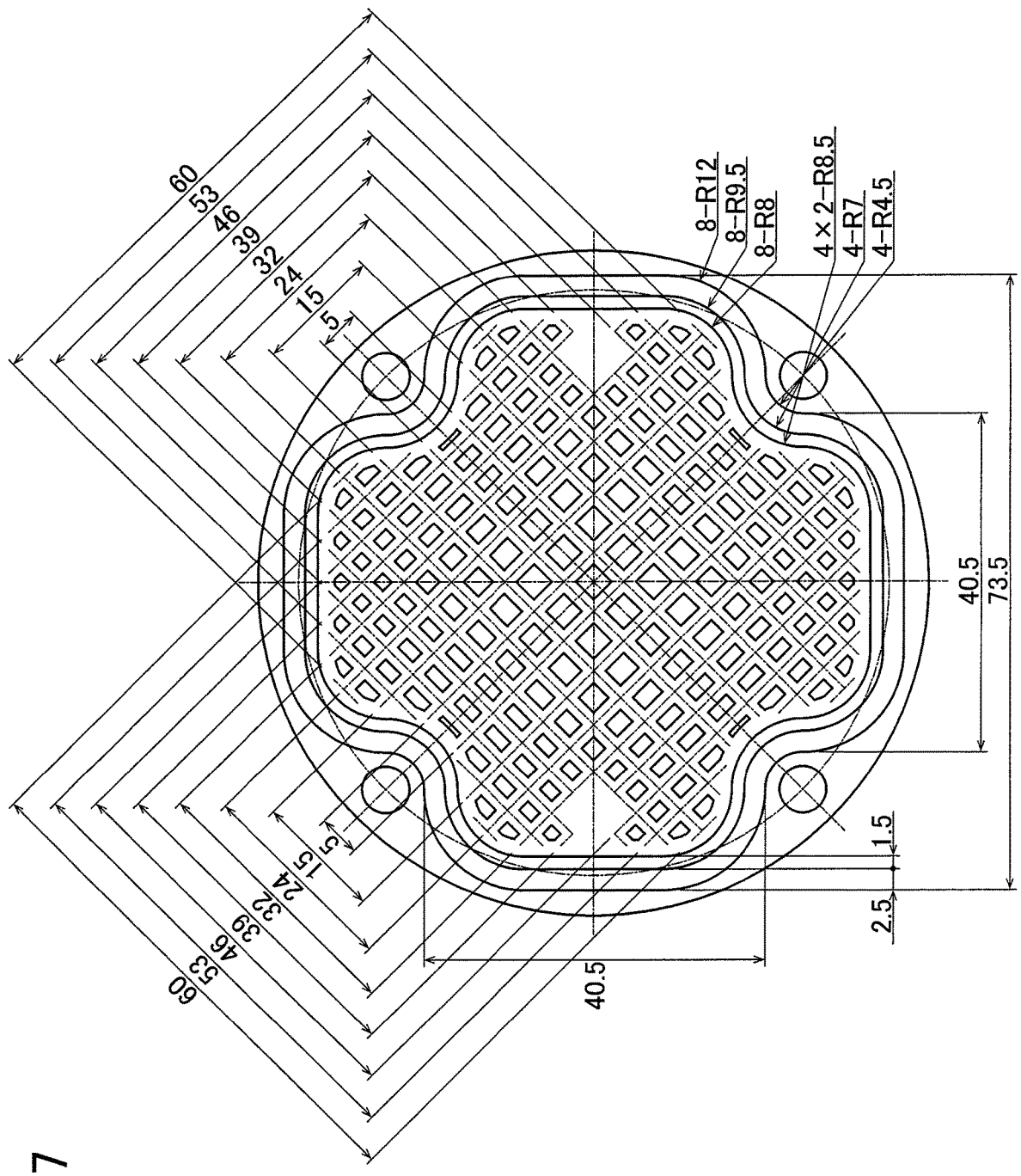
FIG. 7 is a plan view of a variation (third variation) of the plate member of the heat exchanger, in which exemplary detailed dimensions are provided.
Figure 8:
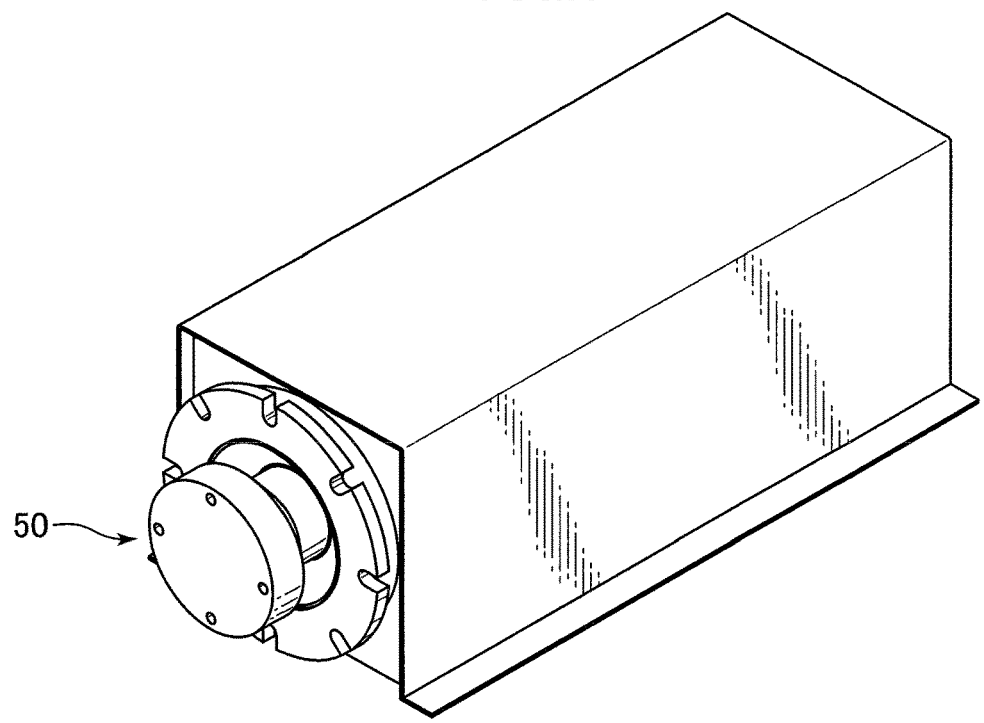
FIG. 8 is a perspective view of a Stirling type of refrigerator.
Figure 9:
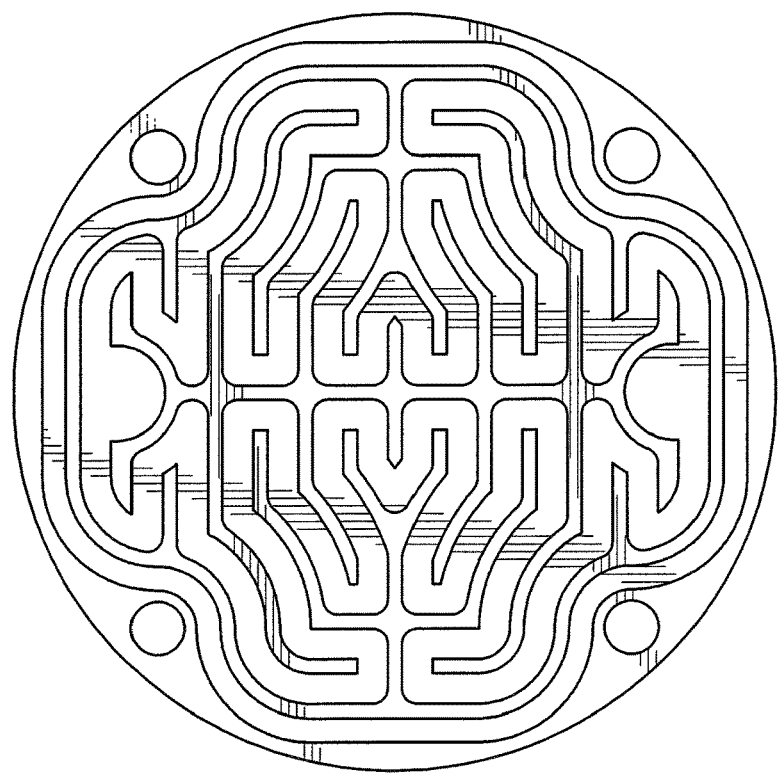
FIG. 9 is a plan view for explaining a labyrinth-like refrigerant flow path.

From the above embodiment, the width of each groove element was increased to 2.0 mm. In this case as well, high heat-exchange performance as much as 180 W was achieved, and also the pressure loss was reduced to about 30.7 kPa. Herein, In this case, as shown in FIG. 7, the gaps between central lines of adjacent groove elements were 5.0 mm, 5.0 mm (×1), 4.5 mm (×1), 4.0 mm (×1) and 3.5 mm (×4) in order of from the central side.

SUMMARY OF EFFECTS

As described above, according to the above embodiment and its variations, the refrigerant can flow in a well-balanced manner in respective routes from the area 22a on the one side communicating with the refrigerant inlet 31 toward the area 22b on the other side communicating with the refrigerant outlet 32. Thereby, a pressure low of the refrigerant in the whole heat exchanger 10 can be effectively suppressed.

In addition, since the refrigerant flow path 22 has the rhombic lattice pattern in plan view, the high heat-exchange performance can be achieved easily. In addition, it is easy to design and manufacture the higher or lower arrangement density of the refrigerant flow path 22.

In addition, since the groove elements of the rhombic lattice pattern are constant in width perpendicular to an extending direction of each groove element, the groove elements can be manufactured by means of the same machining tool, which facilitates the manufacturing process. In addition, it is easy to design them as well.

In order to facilitate the manufacturing process, it is preferable that the plate member 20 and the plate cover 30 are separate. However, functionally, this is not essential.

DESCRIPTION OF REFERENCE SIGNS

10 Heat exchanger
20 Plate member
21 Bottom part
22 Refrigerant flow path
22a Area on one side
22b Area on the other side
30 Plate cover
31 Refrigerant inlet
32 Refrigerant outlet

What is claimed is:

1. A heat exchanger comprising
a plate member having a flat bottom part and having a refrigerant flow path formed therein; and
a plate cover configured to cover the plate member;
wherein
the plate cover has: a refrigerant inlet communicating with an area on one side of the refrigerant flow path of the plate member and; a refrigerant outlet communicating with an area on the other side of the refrigerant flow path of the plate member, and
arrangement density of the refrigerant flow path is higher in an area far from a straight line which connects the area on the one side communicating with the refrigerant inlet to the area on the other side communicating with the refrigerant outlet, than in an area close to the straight line which connects the area on the one side communicating with the refrigerant inlet to the area on the other side communicating with the refrigerant outlet.

2. The heat exchanger according to claim 1, wherein
the refrigerant flow path has a rhombic lattice pattern in plan view.

3. The heat exchanger according to claim 2, wherein
groove elements of the rhombic lattice pattern are constant in width perpendicular to an extending direction of each of the groove elements, and
the arrangement density of the refrigerant flow path is dependent on arrangement density of the groove elements of the rhombic lattice pattern.

4. The heat exchanger according to claim 3, wherein
each of the groove elements has a width of 1.2 mm to 2.0 mm,
each of the groove elements has a depth of 5.0 mm to 8.0 mm, and
the plate member has a thickness of 7.0 mm to 10.0 mm.

5. The heat exchanger according to claim 1, wherein
the plate member has a circular disk-like shape in plan view,
the straight line, which connects the area on the one side communicating with the refrigerant inlet to the area on the other side communicating with the refrigerant outlet, extends in a diametric direction of the plate member.

6. The heat exchanger according to claim 5, wherein
the arrangement density of the refrigerant flow path is higher in an area far from a center of the plate member, than in an area close to the center of the plate member.

7. A heat exchanger having a flat bottom part and having a refrigerant flow path formed therein, wherein
a refrigerant inlet communicating with an area on one side of the refrigerant flow path and a refrigerant outlet communicating with an area on the other side of the refrigerant flow path are provided to protrude in the same direction, and arrangement density of the refrigerant flow path is higher in an area far from a straight line which connects the area on the one side communicating with the refrigerant inlet to the area on the other side communicating with the refrigerant outlet, than in an area close to the straight line which connects the area on the one side communicating with the refrigerant inlet to the area on the other side communicating with the refrigerant outlet.

* * * * *